(12) United States Patent
Hamanaka et al.

(10) Patent No.: US 7,989,825 B2
(45) Date of Patent: Aug. 2, 2011

(54) LENS-ATTACHED LIGHT-EMITTING ELEMENT AND METHOD FOR MANUFACTURING THE SAME

(75) Inventors: Kenjiro Hamanaka, Minato-ku (JP); Takahiro Hashimoto, Minato-ku (JP); Hideshi Nagata, Minato-ku (JP); Seiji Ohno, Minato-ku (JP); Isao Muraguchi, Minato-ku (JP); Nobuyuki Komaba, Minato-ku (JP)

(73) Assignee: Fuji Xerox Co., Ltd., Tokyo (JP)

( * ) Notice: Subject to any disclaimer, the term of this patent is extended or adjusted under 35 U.S.C. 154(b) by 1202 days.

(21) Appl. No.: 10/562,655

(22) PCT Filed: Jun. 24, 2004

(86) PCT No.: PCT/JP2004/009265
§ 371 (c)(1),
(2), (4) Date: Jun. 13, 2006

(87) PCT Pub. No.: WO2005/001944
PCT Pub. Date: Jan. 6, 2005

(65) Prior Publication Data
US 2007/0057268 A1    Mar. 15, 2007

(30) Foreign Application Priority Data

| Jun. 26, 2003 | (JP) | 2003-182604 |
| Jun. 26, 2003 | (JP) | 2003-182610 |
| Mar. 23, 2004 | (JP) | 2004-084182 |
| Mar. 25, 2004 | (JP) | 2004-088330 |
| Jun. 4, 2004 | (JP) | 2004-166560 |

(51) Int. Cl.
H01L 33/00    (2010.01)

(52) U.S. Cl. ........... 257/95; 257/99; 257/E33.059; 359/710; 359/796; 359/797; 362/268; 362/315; 362/335

(58) Field of Classification Search ............ 257/79, 257/88, 95, 98, 99, 100, E33.059; 359/710, 359/717, 718
See application file for complete search history.

(56) References Cited

U.S. PATENT DOCUMENTS 3,954,534 A * 5/1976 Scifres et al. .............. 438/29

(Continued)

FOREIGN PATENT DOCUMENTS

| JP | 1238962 | 9/1989 |
| JP | 2014584 | 1/1990 |
| JP | 2092650 | 4/1990 |

(Continued)

OTHER PUBLICATIONS

International Search Report for Int'l Application No. PCT/JP2004/009265 dated Nov. 2, 2004.

*Primary Examiner* — Lynne A Gurley
*Assistant Examiner* — Jesse Y Miyoshi
(74) *Attorney, Agent, or Firm* — RatnerPrestia

(57) ABSTRACT

A lens-attached light-emitting element having an improved optical availability efficiency includes a composite lens provided on an approximately U-shaped light-emitting area of the light emitting element array. Four spherical lenses are arranged in such a manner that each is centered in the neighborhood the an end of a respective one of three segments of a U-shaped polygonal line corresponding to positions where light emitted by the U-shaped light-emitting area is a maximum Three cylindrical lens are arranged between two of the spherical lens, respectively, each cylindrical lens having an axis parallel with each segment. These four spherical lenses and three cylindrical lenses together constitute the composite lens. The light-emitting element further comprises an antireflection film covering the light-emitting area, and the composite lens is formed on the surface of the antireflection film.

19 Claims, 12 Drawing Sheets

U.S. PATENT DOCUMENTS

| | | | |
|---|---|---|---|
| 4,644,342 A * | 2/1987 | Abbas | 345/46 |
| 4,703,219 A * | 10/1987 | Mesquida | 313/111 |
| 5,530,268 A * | 6/1996 | Ogihara et al. | 257/88 |
| 5,711,890 A * | 1/1998 | Hawkins et al. | 216/24 |
| 6,002,420 A * | 12/1999 | Tanioka et al. | 347/237 |
| 6,188,527 B1 * | 2/2001 | Bohn | 359/710 |
| 6,514,877 B1 * | 2/2003 | Beauvais et al. | 430/5 |
| 6,888,171 B2 * | 5/2005 | Liu et al. | 257/99 |
| 2001/0010449 A1 * | 8/2001 | Chiu et al. | 313/501 |

FOREIGN PATENT DOCUMENTS

| | | |
|---|---|---|
| JP | 2092651 | 4/1990 |
| JP | 2263668 | 10/1990 |
| JP | 9109455 | 4/1997 |
| JP | 09-102631 | 5/1997 |
| JP | 2000347317 | 12/2000 |
| JP | 2001036144 | 2/2001 |
| JP | 2001-217467 A | 8/2001 |
| JP | 2002-141556 A | 5/2002 |

* cited by examiner

LENS-ATTACHED LIGHT-EMITTING ELEMENT AND METHOD FOR MANUFACTURING THE SAME

TECHNICAL FIELD

The present invention relates to a lens-attached light-emitting element, particularly to a lens-attached light-emitting element having an improved optical availability efficiency and a method for manufacturing the lens-attached light-emitting element.

BACKGROUND ART

An optical system of a writing head in an optical printer is usually designed so that an image of light spot of respective LEDs, (Light-Emitting Diode) constructing an LED array is focused on a photosensitive drum through a lens array. As a lens array, a distributed index rod lens array is often used.

A typical construction of an LED array, a distributed index rod lens array, and a photosensitive drum used in a conventional optical printer is shown in FIG. 1. In the figure, the LED is designated by reference numeral 10, the rod lens array by reference numeral 12, and the photosensitive drum by reference numeral 14.

An effective aperture angle $\theta$ of the lens array 12 is in the range of 17°-20° as a half angle, whereas the LED 10 emits light principally in Lambertian distribution, so that an optical availability efficiency is extremely low. The only 3-5% of the light emitted in a Lambertian distribution from the LED is transmitted to the photo-sensitive dram 14 through the lens array 12. This means that only the 95-97% of the light emitted by the LED is not utilized, resulting in a problem of a low optical availability efficiency.

In order to increase the optical availability efficiency, it is conceivable that a micro lens array is provided directly on the light-emitting area of the LED to cause the directivity of the light ray from the LED narrower so as to increase the light ray impinging into an aperture angle of the lens array. In general, the central part of the light-emitting area of the LED array used for an optical printer is covered by an electrode 20 extending into the light-emitting area 22, so that the shape of an effective light-emitting area 22 is approximately U-shaped as shown in FIG. 2. In order to cause the directivity of the light ray from the light-emitting area 22 narrower by means of a conventional micro lens array 18 as shown in FIG. 3, it is preferable that the light ray designated by a dotted-line 24 neighbored to an optical axis of the lens is utilized. However, the area neighbored to the optical axis corresponds to the position of the electrode 20, resulting in the problem such that the optical availability efficiency may not be fully increased.

An LED array provided with a micro lens array has been disclosed in Japanese Patent Publication Nos. 9-109455, 2000-347317, and 2001-36144. However, these publications have not discussed such a problem and the shape of a micro lens.

It is noted that the above-described problem is applied not only to an LED but also another light-emitting element.

DISCLOSURE OF THE INVENTION

An object of the present invention is to improve the optical availability efficiency of a light-emitting element array used for an optical printer in which the light-emitting area of the light-emitting element array is imaged on a photosensitive drum through a lens array.

Another object of the present invention is to provide a lens-attached light-emitting element having an improved optical availability efficiency.

A further object of the present invention is to provide a lens-attached light-emitting element array having an improved optical availability efficiency.

A still further object of the present invention is to provide a method for manufacturing a lens-attached light-emitting element having an improved optical availability efficiency in a light-emitting element array used for an optical printer in which the light-emitting area of the light-emitting element array is imaged on a photosensitive drum through a lens array.

A lens-attached light-emitting element according to the present invention comprises a light-emitting element having a light-emitting area on a semiconductor substrate, an antireflection film covering the light-emitting area, and a lens formed on the surface of the antireflection film on the light-emitting element.

The antireflection film is one-layer film, and the refractive index thereof has an intermediate value between that of the light-emitting area and that of the resin forming the lens.

If the lens is made of resin having a comparatively large refractive index, the lens may be provided directly on the light-emitting area.

The lens of the lens-attached light-emitting element according to the present invention is not a singular spherical lens but a composite lens consisting of combined plural spherical lens or a composite lens consisting of combined plural spherical lenses and cylindrical lenses.

The design of such composite lens may be implemented in a following manner.

(1) The lens is a composite lens consisting of adjacently arranged plural parts of spherical lens, each center of the spherical lenses being on the curved line or polygonal line imagined by fastening the positions where light intensity is maximum in the light-emission area, or on the positions neighbored to the line, a composite lens consisting of adjacently arranged plural parts of curved or polygonal cylindrical lens, each cylindrical having an axis along the line, or a composite lens consisting of adjacently arranged plural parts of spherical lens and plural parts of cylindrical lens.

(2) In the case that the curved line or polygonal line imagined by fastening the positions where light intensity is maximum in the light-emission area of the light-emitting element has an approximate U-shape, plural parts of spherical lens are positioned on the both ends of each of three segments of the U-shape or the neighborhood of the both ends, and plural parts of cylindrical lenses are arranged between the parts of spherical lens. The parts of spherical lens and parts of cylindrical lens are adjacently arranged to form the composite lens. Herein, "an approximate U-shape" of the curved line or polygonal line imagined by fastening the positions where light intensity is maximum in the light-emission area of the light-emitting element means that the line substantially has a U-shape in total.

(3) In the case of a light-emitting element which is the same as that described in (2), the composite lens is composed of adjacently arranged three parts of spherical lens, each center of the spherical lenses being on the neighborhood of the intermediate position of each segment.

Therefore, a lens-attached light-emitting element in accordance with the present invention comprises a light-emitting element having a light-emitting area, and a composite lens provided on the light-emitting element.

The composite lens consists of adjacently arranged plural parts of spherical lens, each center of the spherical lenses being on the line imagined by fastening the positions where light intensity is maximum in the light-emission area, or on the positions neighbored to the line, a composite lens consisting of adjacently arranged plural parts of cylindrical lens each having an axis along the line, or a composite lens consisting of adjacently arranged plural parts of spherical lens and plural parts of cylindrical lens.

In the case that the line imagined by fastening the positions where light intensity is maximum in the light-emission area of the light-emitting element is an approximately U-shaped polygonal line consisting of three segments, the composite lens is composed of four parts of spherical lens, each center of the spherical lenses being on the both ends of each segment or the neighborhood of the both ends, and three parts of cylindrical lens each having an axis parallel with the segment.

In the case that the line imagined by fastening the positions where light intensity is maximum in the light-emission area of the light-emitting element is an approximately U-shaped polygonal line consisting of three segments, the composite lens is composed of adjacently arranged three parts of spherical lens, each center of the spherical lenses being on the neighborhood of the intermediate position of each segment.

A first aspect of a method for manufacturing a lens-attached light-emitting element in accordance with the present invention comprises the steps of:
(a) preparing a light-emitting element array substrate;
(b) preparing a glass substrate;
(c) forming a etching stopper film on the glass substrate;
(d) forming an opening array in the etching stopper film;
(e) forming a recess array in the glass substrate under the opening array by wet etching;
(f) fabricating a mold by removing the etching stopper film on the recess array;
(g) coating a photo-curing resin on the surface of at least one of the recess array of the mold and the light-emitting element array substrate;
(h) contacting the mold and the light-emitting element array substrate to each other with sandwiching the photo-curing resin therebetween and pressing to each other to develop the photo-curing resin therebetween;
(i) irradiating light to the photo-curing resin from the side of the mold to cure the photo-curing resin at the portion where the etching stopper film is previously removed;
(j) separating the mold from the light-emitting element array substrate; and
(k) removing the uncured photo-curing resin on the light-emitting element array substrate by cleaning.

A second aspect of a method for manufacturing a lens-attached light-emitting element in accordance with the present invention comprises the steps of:
(a) preparing a light-emitting element array substrate, the predetermined portion thereof being masked by a tape;
(b) preparing a glass substrate;
(c) forming a etching stopper film on the glass substrate;
(d) forming an opening array in the etching stopper film;
(e) forming a recess array in the glass substrate under the opening array by wet etching;
(f) fabricating a mold by removing the etching stopper film on the recess array;
(g) coating a photo-curing resin on the surface of at least one of the recess array of the mold and the light-emitting element array substrate;
(h) contacting the mold and the light-emitting element array substrate to each other with sandwiching the photo-curing resin therebetween and pressing to each other to develop the photo-curing resin therebetween;
(i) irradiating light to the photo-curing resin from the side of the mold to cure the photo-curing resin;
(j) separating the mold from the light-emitting element array substrate; and
(k) peeling off the tape from the light-emitting element array substrate to remove the uncured photo-curing resin on the tape.

While the lens may be a spherical or aspherical lens, a composite lens according to the present invention is preferable depending on the shape of a light-emitting area.

BEST MODE FOR CARRYING OUT THE INVENTION

An embodiment of a lens-attached light-emitting element in accordance with the present invention will now be described.

Embodiment 1

Figure 1:
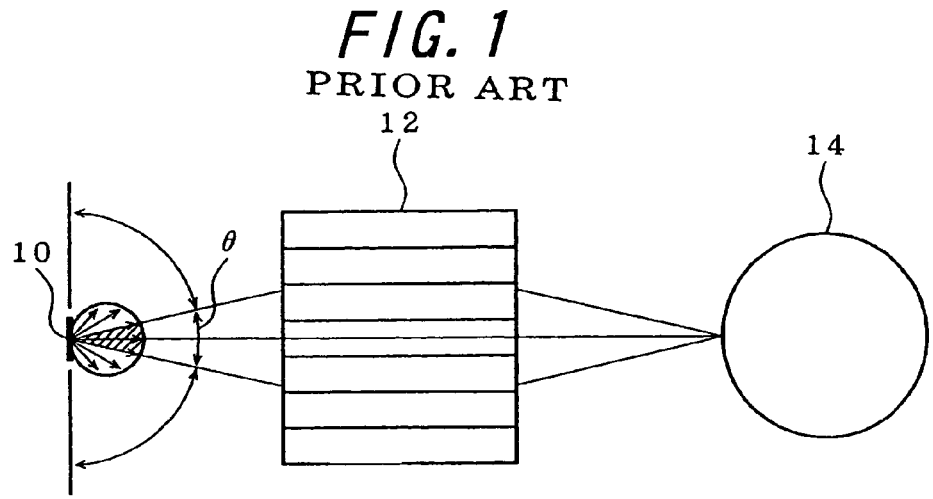
FIG. 1 shows a typical construction of an LED array, a distributed index rod lens array, and a photosensitive drum used in a conventional optical printer.
Figure 2:
FIG. 2 shows a shape of a light-emitting area.
Figure 3:
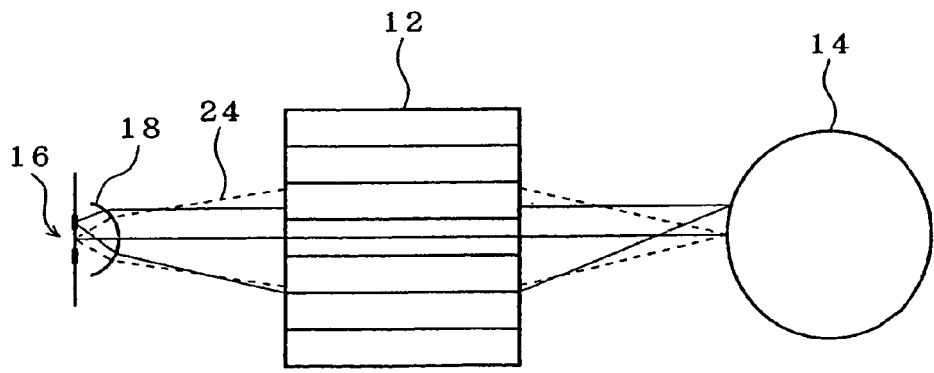
FIG. 3 shows a light ray to a photosensitive drum in the case that a conventional lens-attached LED array is used.
Figure 4A:
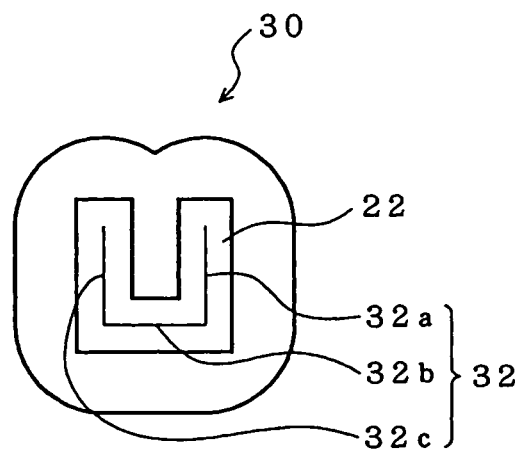
FIGS. 4A and 4B show an embodiment of the lens-attached light-emitting element in accordance with the present invention.

In a lens-attached light-emitting element in accordance with the present invention, a composite lens 30 is provided on an approximately U-shaped light-emitting area 22 of an LED as shown in FIG. 4A.

If the positions where light intensity is maximum in the approximately U-shaped light-emitting area 22 are fastened, then a U-shaped polygonal line 32 consisting of three segments is imagined. Four parts of spherical lens are arranged in such a manner that each center thereof is at the both ends or the neighborhood of the both ends of respective three segments of the polygonal line 32, and three parts of cylindrical lens are arranged between two parts of spherical lens, respectively, each cylindrical lens having an axis parallel with said each segment. These four parts of spherical lens and three partial cylindrical lens are neighbored together to constitute the composite lens 30.

As the material for the composite lens, an epoxy resin or acrylic resin may be used.

Figure 4B:
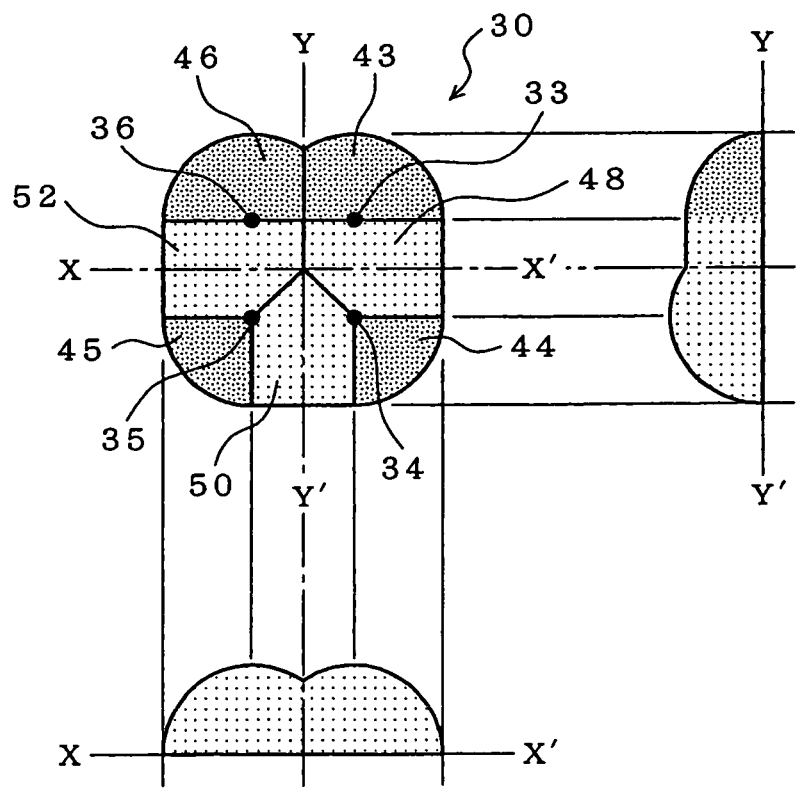

FIG. 4B shows a plan view and sectional views of the composite lens 30. In the figure, dots 33, 34, 35, 36 designate respective both ends of three segments 32a, 32b and 32c of the diagonal line 32 shown in FIG. 4A. The composite lens 30 comprises a part of a spherical lens 43, the center the spherical lens being coincident with the dot 33, a part of a spherical lens 44, the center of the spherical lens being coincident with the dot 34, a part of a spherical lens 45, the center of the spherical lens being coincident with the dot 35, and a part of a spherical lens 46, the center of the spherical lens being coincident with the dot 36. The composite lens 30 further comprises a part of a cylindrical lens 48, the axis of the cylindrical lens being parallel with the segment 32a, a part of a cylindrical lens 50, the axis of the cylindrical lens being parallel with the segment 32b, and a part of a cylindrical lens 52, the axis of the cylindrical lens being parallel with the segment 32c. These four parts of spherical lens and three parts of cylindrical lens are arranged as shown in FIG. 4B. In the figure, the sectional-views taken along X-X' and Y-Y' lines, respectively, are shown for easy understanding of the shape of the composite lens.

In this manner, the composite lens 30 is a lens having a particular shape consisting of combined parts of spherical lens and parts of cylindrical lens provided on corresponding respective portions of the approximately U-shaped light-emitting area 22.

Figure 5:
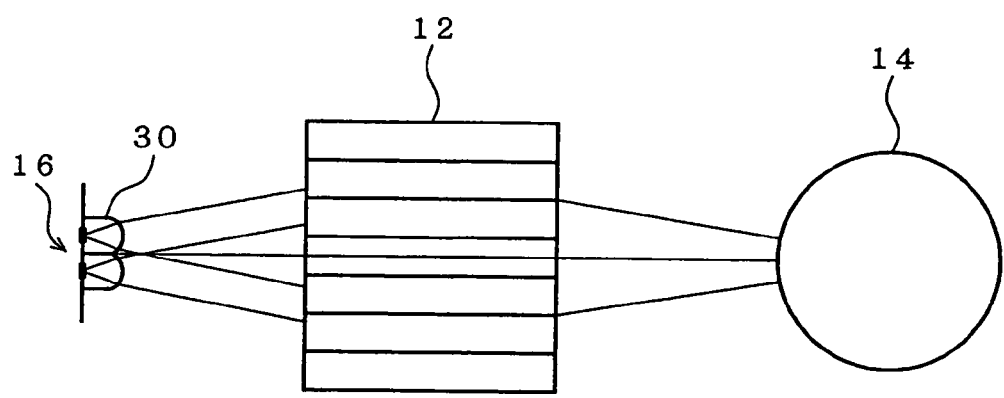
FIG. 5 shows a light ray to a photosensitive drum in the case that a lens-attached LED array in accordance with the present invention.

By using such composite lens formed so as to correspond with the approximately U-shaped light-emitting area, the light ray may be refracted toward a light axis direction, i.e., toward a rod lens array in each portion of the approximately U-shaped light-emitting area. As a result, the directivity of the Lambertian emitted light may be narrowed as shown in FIG. 5.

Figure 6A:
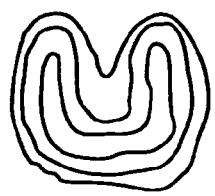
FIGS. 6A and 6B show the distribution of amount of light of pixel image formed on the photosensitive drum through the rod lens array by utilizing the composite lens array.
Figure 6B:
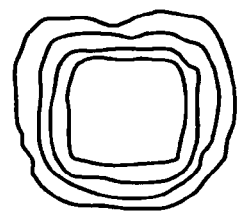

FIG. 6A shows the distribution of amount of light of pixel image formed on the photosensitive drum 14 through the rod lens array 12 by utilizing the composite lens array 30 according to the present invention. It is appreciated that the lower amount of light in the central portion of the pixel was disappeared in comparison with the distribution of the amount of light in the central portion of the pixel in the case that a composite lens was not utilized, so that the preferable distribution could be obtained. When the amount of light was determined for this case, it was appreciated that 1.7 times brightness was realized in comparison with the case that a composite lens was not utilized.

In accordance with the present embodiment described above, it was appreciated that the improvement of an optical availability efficiency was realized.

Figure 7:
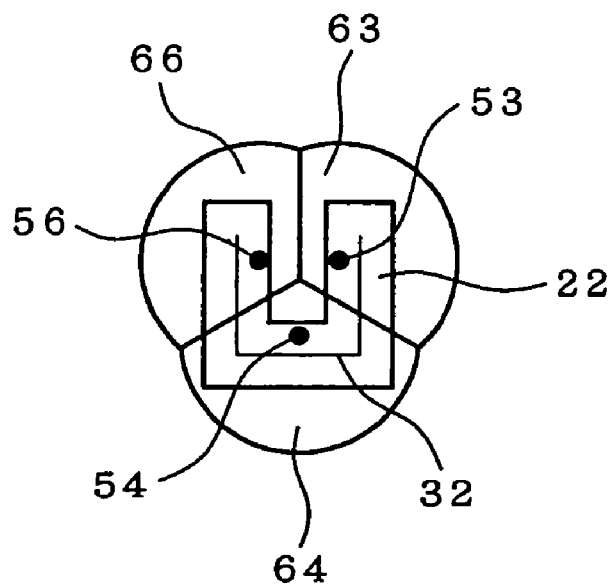
FIG. 7 shows another embodiment of the lens-attached light emitting element in accordance with the present invention.

According to the present invention, a similar effect may be obtained in a composite lens such that three parts of spherical lens are provided on the approximately U-shaped light-emitting area 22 and are arranged like "a three-leaf clover" with each center of the spherical lenses being coincident with the corresponding portion of the area 22 as shown in FIG. 7.

This composite lens is designed in a following manner. When the positions where light intensity is maximum in the approximately U-shaped LED light-emission area are fastened, a U-shaped polygonal line 32 consisting of three segments is imagined. Three parts of spherical lens 63, 64 and 66 are adjacently arranged in such a manner that respective centers 53, 54 and 56 of the spherical lenses are positioned at the neighborhood of intermediate positions of respective three segments.

In general, the refractive index of the light-emitting area made of a semiconductor material is in a range of 3.2-3.7, whilst the refractive index of GaAs semiconductor of LED especially used in an LED printer is in a range of 3.3-3.6. If the light emitted from the GaAs semiconductor is radiated directly to an air space, an optical availability efficiency is extremely decreased due to the reflection on the interface to air. Also, the refractive index of the resin used in the composite lens is generally small in comparison to that of a semiconductor material, so that a reflection is caused at the interface between the semiconductor and the resin.

A resin lens is provided in order to increase an optical availability efficiency according to the present invention as described above. In spite of that, if an optical availability efficiency due to the reflection on the interface is decreased, the effect of the resin lens will be lost. Consequently, means for preventing the decrease of an optical availability effect is required considering the refractive index of the resin lens. For this purpose, an antireflection film is coated on the surface of a light-emitting area to decrease the reflection on the interface between the light-emitting area and the resin lens according to the present invention.

Figure 8:
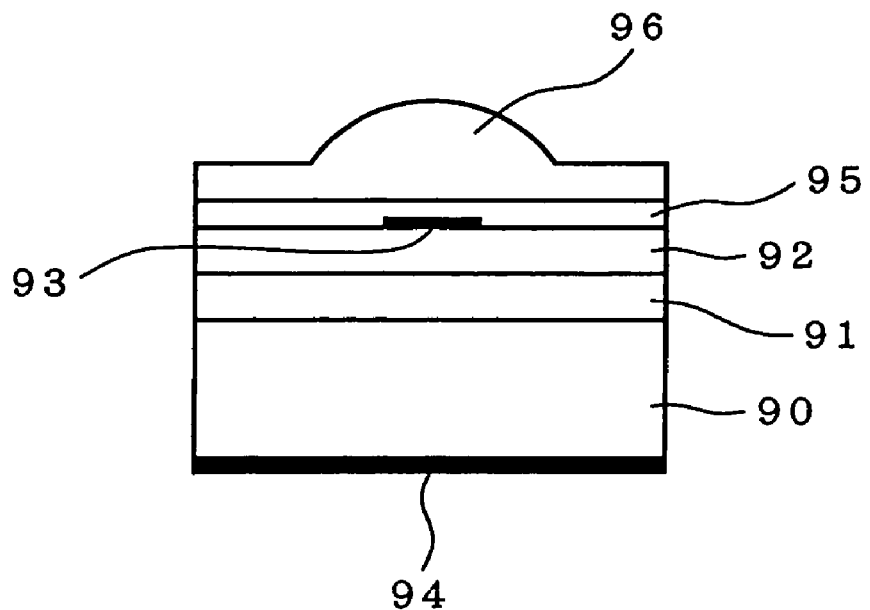
FIG. 8 shows a cross-sectional view of an embodiment of a lens-attached light-emitting element provided with an antireflection film.

FIG. 8 is a cross-sectional view of an embodiment of a lens-attached light-emitting element provided with such an antireflection film. An LED comprises an n-AlGaAs layer 91 and an AlGaAs layer 92 formed on a GaAs substrate 90, a p-electrode 93, and an n-electrode 94. One layer of SiN film 95 having a refraction index in a range of 1.8-2.1 is formed on the surface of the LED light-emitting area as an antireflection film, and a resin lens 96 is formed on the antireflection film.

In the present embodiment, the refractive index of the AlGaAs light-emitting area is in a range of 3.5-3.6, the refractive index of the SiN film in a range of 1.8-2.1, and the refractive index of the resin lens in a range of 1.47-1.7.

In the case that the AlGaAs light-emitting area is in a range of 3.5-3.6, the thickness of the SiN film is in a range of 96-99 nm (or 470-490 nm) corresponding to the antireflection condition for the light wave length of 780 nm. The transmission factor of 93% or more was realized by providing the SiN film. When the amount of light was determined for this case, it was appreciated that 2.2 times brightness was realized in comparison with the case that a lens was not utilized.

While an SiN film is used as an antireflection film in the embodiment described above, the present invention is not limited thereto. For example, a transparent material having a refractive index of an intermediate value between the refractive index of the light-emitting area and that of the resin lens may be used. Also, an antireflecting layer is not limited to one-layer film, but it may be multi-layer film.

If a lens is made of a resin having a comparatively large refractive index, the reflection on the surface of semiconductor layer becomes small in comparison with the case that the light from the light-emitting area is radiated directly to an air space. Therefore, a lens may be formed directly on the light-emitting area without providing an antireflection film.

Embodiment 2

In the embodiment 1, the case that a light-emitting element array is an LED array has been described.

In the present embodiment, "a self-scanning light-emitting element array" is used as a light-emitting element array. The improvement of an optical availability efficiency was appreciated as in the embodiment 1.

The self-scanning light-emitting element array is configured such that a self-scanning function of light-emitting elements is implemented by utilizing a light-emitting thyristor of pnpn structure as a component of the light-emitting element array. Such self-scanning light-emitting element array has been disclosed in Japanese Patent Publication Nos. 1-238962, 2-14584, 2-92650, and 2-92651. Japanese Patent Publication No. 2-263668 has disclosed a self-scanning light-emitting element array having such a structure that a shift part including a transfer element array and a light-emitting part including a light-emitting element array are separated from each other.

Figure 9:
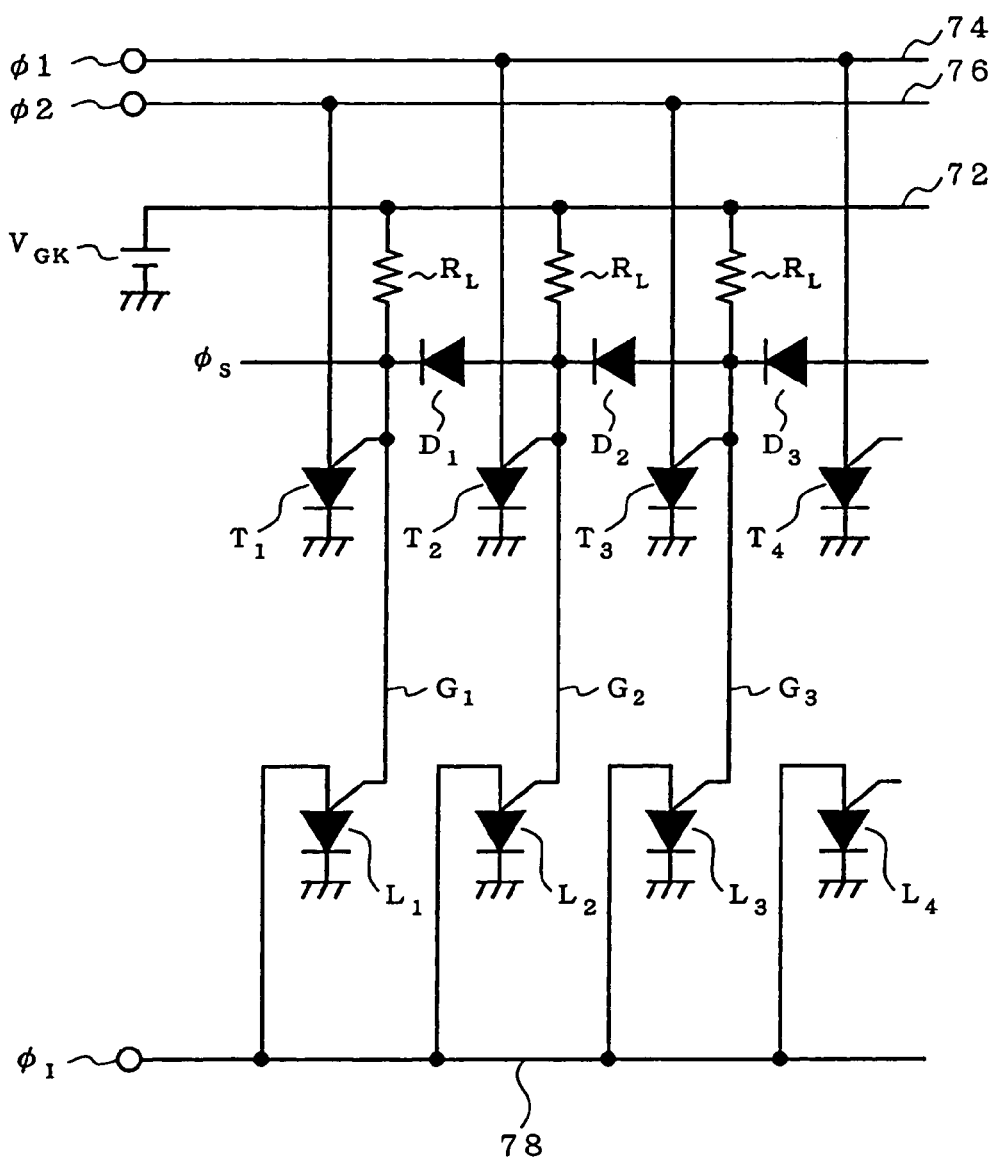
FIG. 9 shows an equivalent circuit of the self-scanning light-emitting element array.

FIG. 9 shows an equivalent circuit of a separated type of self-scanning light-emitting element array. The shift part has transfer thyristors $T_1, T_2, T_3 \ldots$, and the light-emitting part has write light-emitting thyristors $L_1, L_2, L_3 \ldots$. The shift part uses a diode-connection. VGK is a power source (ordinarily 5 volts) and is connected through load resistors $R_L$ to gate electrodes $G_1, G_2, G_3 \ldots$ of the respective transfer thyristors. The gate electrodes $G_1, G_2, G_3 \ldots$ of the transfer thyristors are connected also to the gate electrodes of the write light-emitting thyristors. A start pulse $\phi_s$ is applied to the gate electrode of the transfer thyristor $T_1$, and transfer clock pulses $\phi 1$ and $\phi 2$ are alternately applied to the anode electrodes of the transfer thyristor through the clockpulse lines 74 and 76, and a write signal $\phi_I$ is applied to the anode electrodes of the write light-emitting thyristors through the signal line 78.

Figure 10:
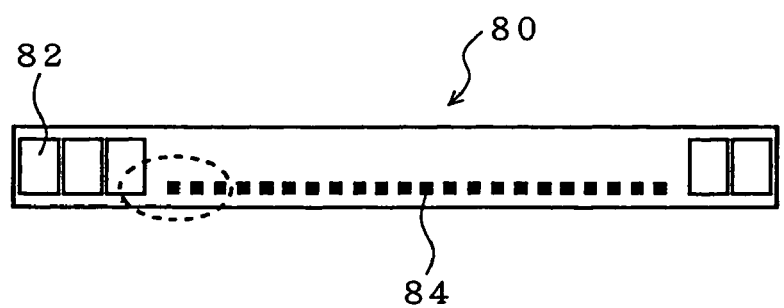
FIG. 10 shows a chip of the self-scanning light-emitting element array.

FIG. 10 shows a chip 80 of such self-scanning light-emitting element array. Bonding pads 82 are provided on both ends of the chip, and light-emitting areas (approximately U-shaped) 84 are arrayed in a straight line along the edge of the chip. It is noted that the transfer thyristor array is omitted in the figure.

Figure 11:
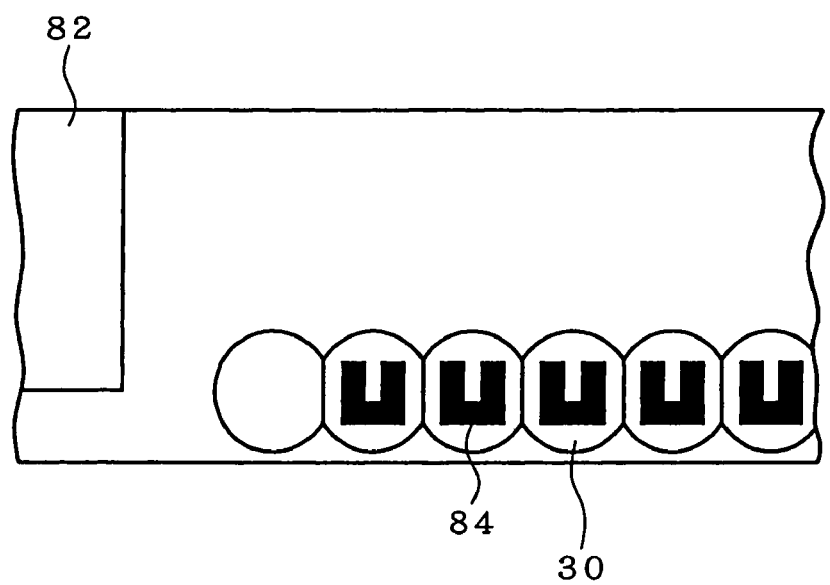
FIG. 11 is an enlarged view of a part of the light-emitting thyristors provided with a composite lens array.
Figure 12:
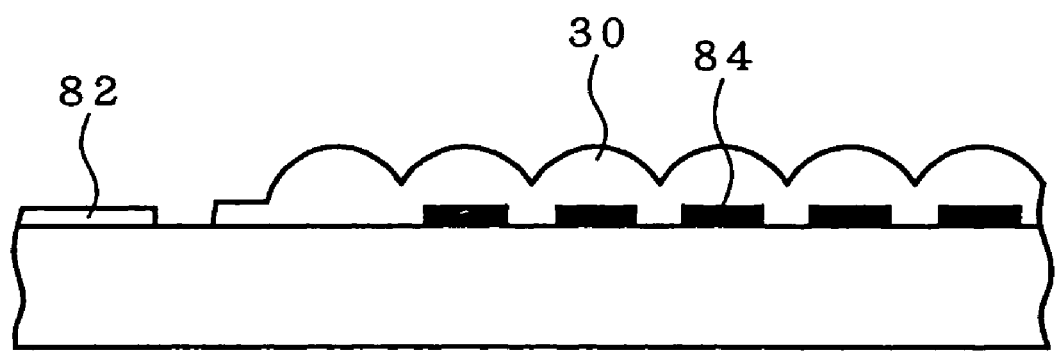
FIG. 12 shows a side view of the light-emitting thyristor provided with the composite lens array in FIG. 11.

The present invention is applicable to the light-emitting thyristors of the self-scanning light-emitting element array. FIG. 11 is an enlarged view of a part of the light-emitting thyristor array provided with a composite lens array. The enlarged portion corresponds to the area circled by the dotted-line in FIG. 10. FIG. 12 show a side view of the light-emitting thyristor array provided with the composite lens array in FIG. 11.

It will be apparent from FIGS. 11 and 12 that an array consisting of composite lenses 30 described in the embodiment 1 is formed on an array of light-emitting thyristors each thereof having an approximately U-shaped light-emitting area 84.

A method for manufacturing the lens-attached light-emitting element array will now be described.

One example of a method for forming lenses integrally to the self-scanning light-emitting element array used for an optical printer is explained.

Figure 13:
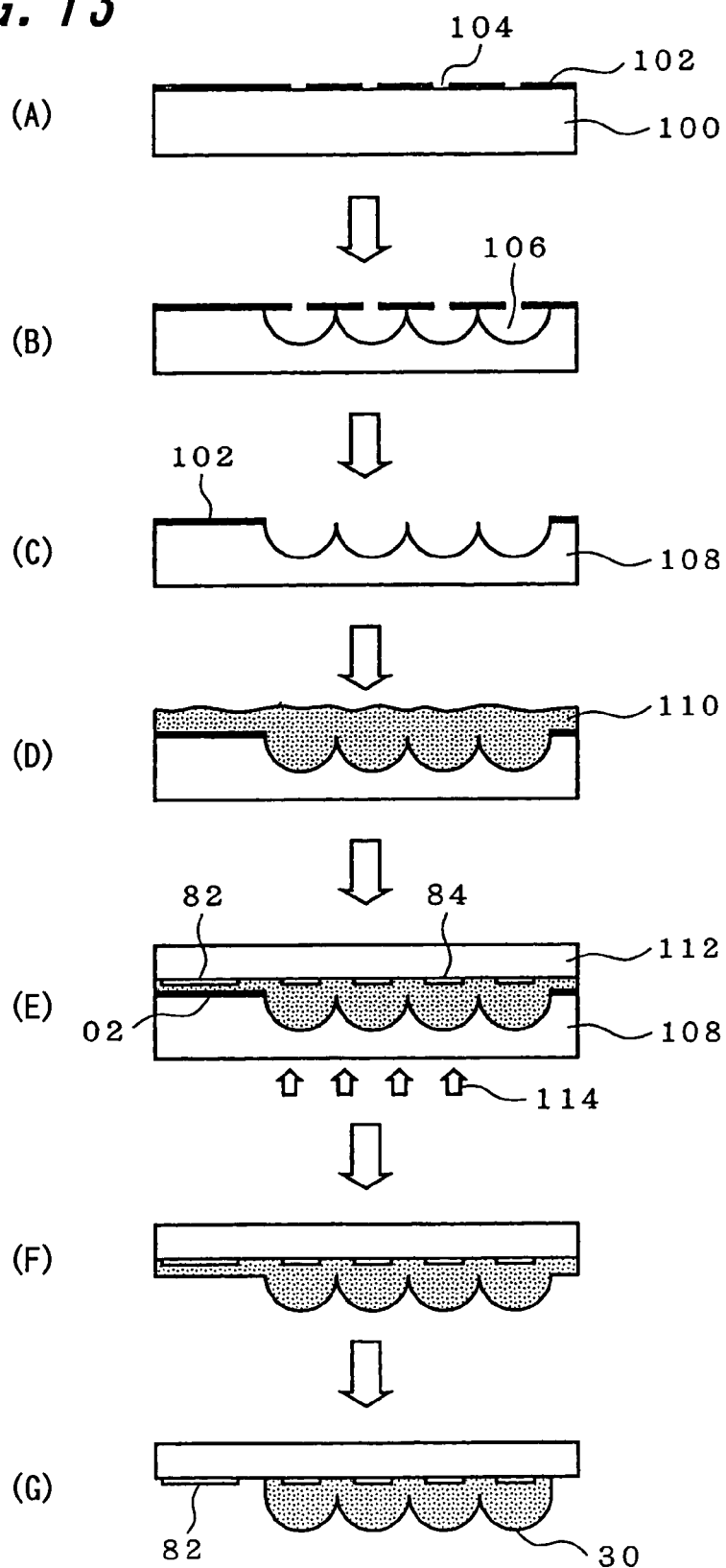
FIG. 13 shows a process for manufacturing a lens-attached light-emitting thyristor array of the self-scanning light-emitting element array.

FIG. 13 shows a process for manufacturing a lens-attached light-emitting thyristor array of the self-scanning light-emitting element array. It is noted that composite lenses as shown in FIGS. 4A and 4B are formed.

First, a Cr film 102 is coated on a silica glass substrate 100 as shown at a step (A) in FIG. 13, and then an array of openings 104 are opened in the Cr film by a lithography method. The array pitch of the openings 104 is selected to be 42.3 µm corresponding to the resolution, 600 DPI (Dot per Inch), of the printer.

Figure 14:
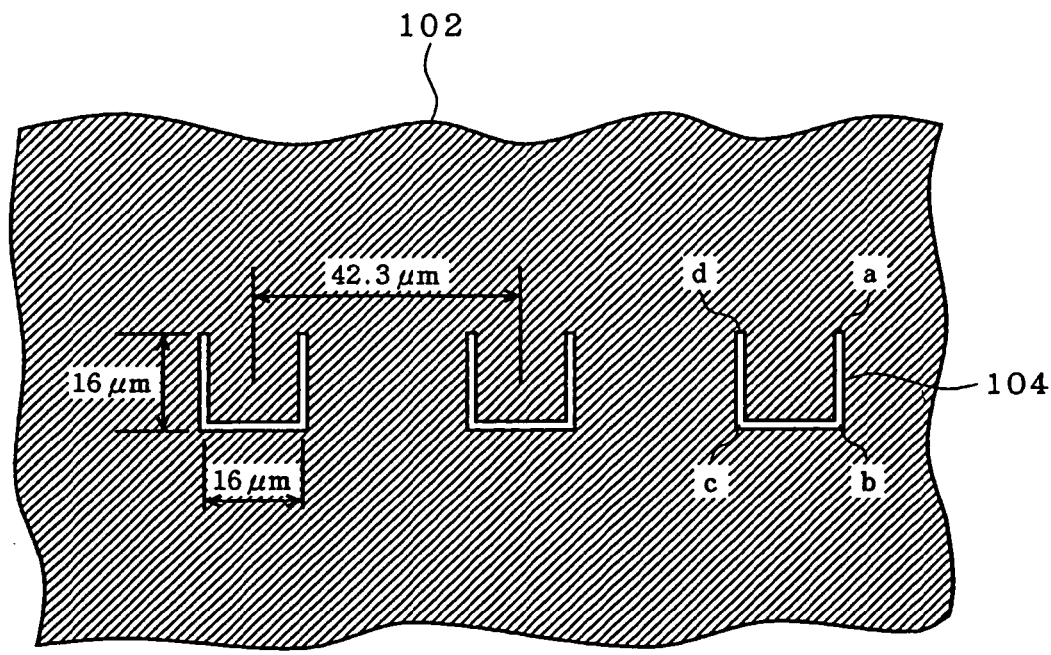
FIG. 14 shows a plan view of the silica glass substrate provided with the Cr film in which an array of openings is patterned.

FIG. 14 is a plan view of the silica glass substrate provided with the Cr film in which an array of openings is patterned. The shape of each opening 104 is approximate U-shape as shown in the figure, the width thereof being approximately 2 µm and the length of one segment being 16 µm. The position of the opening is substantially coincident with the position where the amount of light is maximum on the approximately U-shaped light-emitting area of the light-emitting thyristor. In the case of general spherical lens, it will be understood that an opening is a simple small circular opening (the diameter thereof is in a range of 1-5 µm).

Next, the silica glass substrate 100 provided with the Cr film is wet etched using hydrofluoric acid to form a recess 106 as shown at a step (B) in FIG. 13. The shape of the recess corresponds to that of the composite lens composed of the adjacently arranged spherical lenses and cylindrical lenses as shown in FIGS. 4A and 4B.

In FIG. 14, the ends and corners of the U-shaped opening 104 are now designated by alphabetical letters a, b, c, and d.

The glass substrate is isotropically etched by hydrofluoric acid. Therefore, the etching proceeds in a hemispherical manner from the ends a and d, and the corners b and c. Also, the etching proceeds in a cylindrical manner from the portion between the end a and the corner b, the portion between the corner b and the corner c, and the portion between the corner c and the end d. Therefore, the recess shape corresponding to the shape of the composite lens shown in FIGS. 4A and 4B is formed.

Next, the Cr film 102 floated by the etching process is pasted by an adhesive film (not shown), is broken by pushing an elastic substrate to the Cr film, and the adhesive film is peeled off to remove the Cr film in the etching area. The step (C) in FIG. 13 shows the condition after removing the Cr film. The glass substrate thus formed is used as a stamper (i.e., a mold) 108 in the following steps.

After coating a mold releasing agent on the surface of the stamper 108, a photo (ultra violet)—curing resin 110 is dropped and coated by a dispenser without foaming as shown at the step (D) in FIG. 13. A resin having characteristics listed below is used.

| | |
|---|---|
| Cure shrinkage ratio: | 6% or less |
| Viscosity: | 100-2000 cp (25° C.) |
| Cured hardness: | H-5H |
| Bond strength: | 5 kg/mmφ or more |

Either a epoxy resin or acrylic resin may be used as the photo-curing resin. It is noted that a heat-curing resin requiring a heating is not desirable because a resin is cured on a semiconductor device.

Next, a light-emitting element array wafer 112 on which the light-emitting thyristors are formed is put on the resin 110 as shown at the step (E) in FIG. 13. A number of self-scanning light-emitting element array chips have been formed on the wafer 112. Bonding pads 82 have been formed on the both ends of the chip, and the light-emitting areas (approximately U-shaped) 84 have been arrayed in a straight line along the chip edge. Since the composite lens has to be formed so as to be aligned to the shape of the light-emitting area of the thyristor, the wafer 112 is required to be aligned precisely against the stamper 108. For this purpose, the alignment marks are provided to the wafer 112 and stamper 108, respectively, and they are aligned to each other by using the marks. At this time, the residual Cr film 102 is caused to be opposed to the bonding pad 82 of the chip.

After the wafer 112 is contacted to the photo-curing resin 110, the wafer 112 is pressed to develop the resin 110. The distance between the surface of the thyristor and the upper surface of the lens is optimized by selecting the amount of coated resin, the magnitude of pressure, and the time of pressure.

In order to cure the resin 110, the ultra violet 114 having the wave length of 300-400 nm and the energy of 14000 nJ/cm$^2$ is irradiated through the stamper 108. While the optimal value of the energy of the ultra violet depends on the resin to be used, the order of magnitude of 5000-20000 mJ/cm$^2$ is a typical value.

The ultra violet outputted from the end of a fiber bundle is collimated by a silica lens to form approximately collimated light, and the collimated light is irradiated approximately perpendicular to the bottom surface of the stamper 108.

After releasing the stamper as shown at the step (F) in FIG. 13, the uncured resin (The portion other than the lens area is covered by the Cr film, so that the resin covered by the film is not exposed by the ultra violet and then is not cured.) is removed by cleaning with solvent. The resulting structure is shown at the step (F) in FIG. 13. It is appreciated that the composite lens 30 is formed on the light-emitting area 84 and the bonding pad 82 is exposed.

Figure 15:
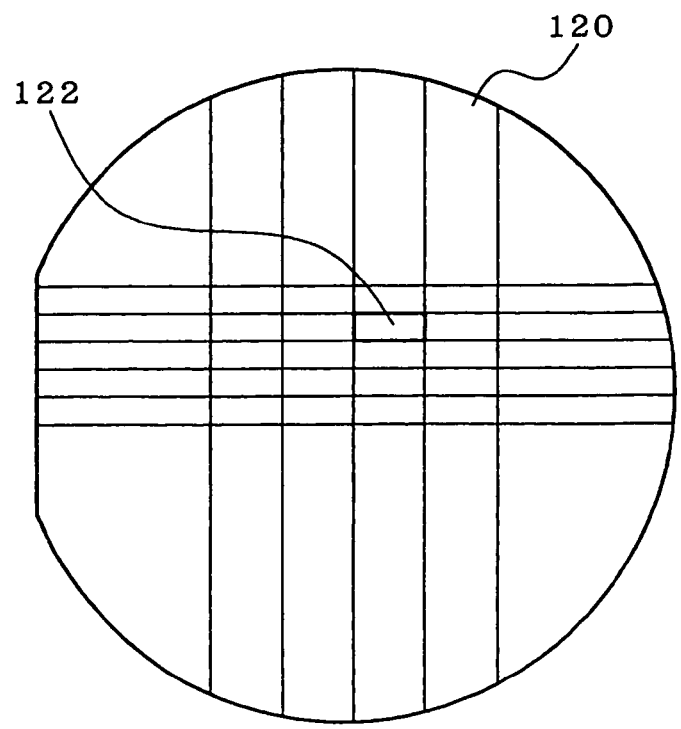
FIG. 15 shows a condition where a wafer is cut.

The wafer 120 thus formed is cut as shown in FIG. 15 to fabricate a self-scanning light-emitting element array chip 122 shown in FIG. 12, the chip including a composite lens array in which parts of spherical lens and parts of cylindrical lens are combined.

While the resin is dropped and coated on the stamper, the resin may be coated on the light-emitting element array wafer. Alternatively, the resin may be coated on both the stamper and light-emitting element array wafer. A method in which the resin may be uniformly coated with including less foams should be selected considering the wettability of the glass substrate and semiconductor substrate on the basis of the characteristic of a resin. While ultra violet is used in the example described above, visible light may also be utilized. In this case, a resin to be cured by visible light is used.

Next, another example of a method for forming lenses integrally to the self-scanning light-emitting element array used for an optical printer is explained.

Figure 16:
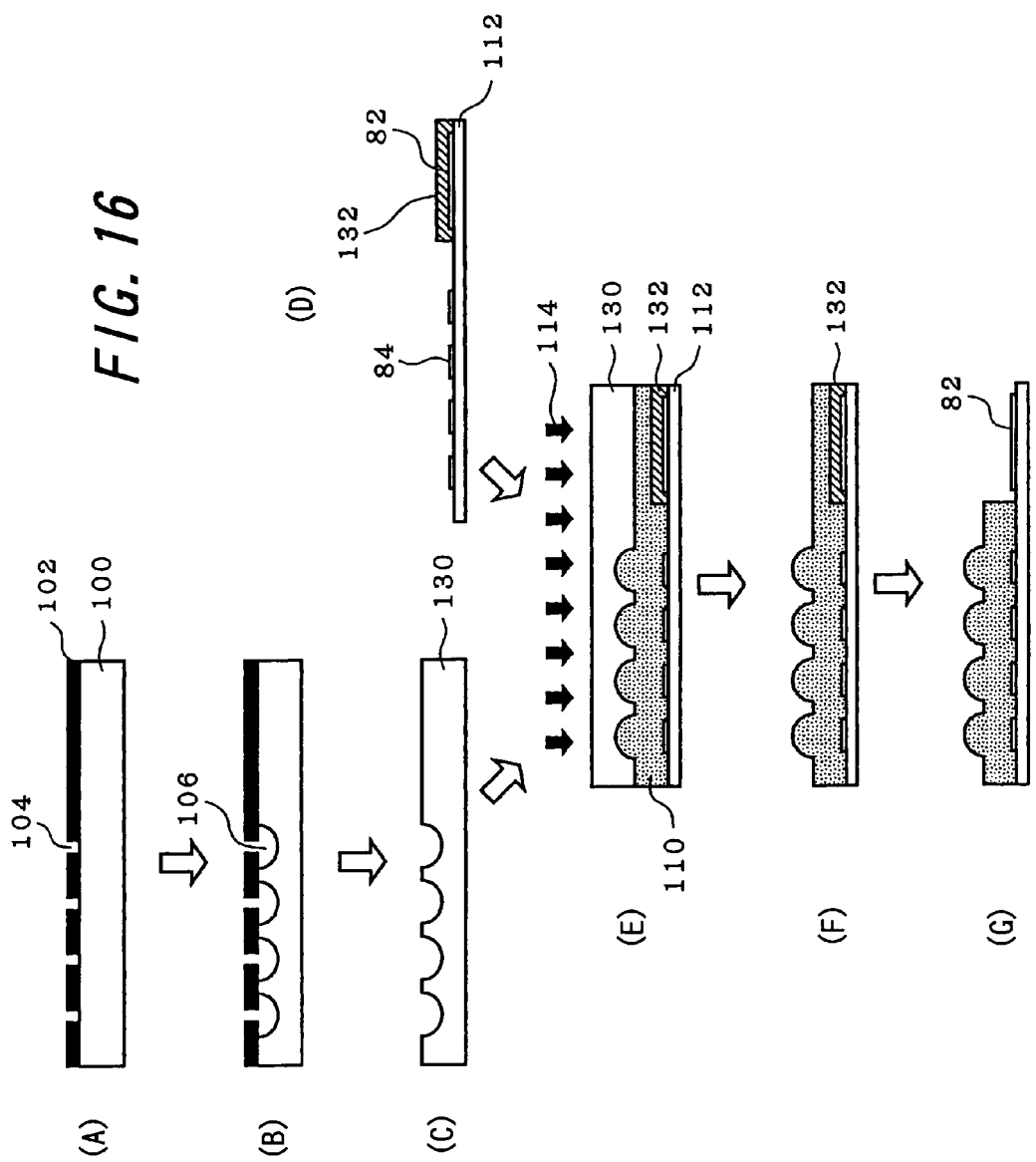
FIG. 16 shows a process for manufacturing a lens-attached light-emitting thyristor array of the self-scanning light-emitting element array.

FIG. 16 shows a process for manufacturing a lens-attached light-emitting thyristor array of the self-scanning light-emitting element array. It is noted that the composite lenses as shown in FIGS. 4A and 4B are formed. In FIG. 16, the same reference numeral is used for the same element in FIG. 13.

First, a Cr film 102 is coated on a silica glass substrate 100 as shown at the step (A) in FIG. 16, and then an array of openings 104 are opened in the Cr film by a lithography method. FIG. 14 is a plan view of the silica glass substrate provided with the Cr film in which an array of openings is patterned.

Next, the silica glass substrate 100 provided with the Cr film is wet etched using hydrofluoric acid to form a recess 106 as shown at the step (B) in FIG. 16. The shape of the recess corresponds to that of the composite lens composed of the adjacently arranged spherical lenses and cylindrical lenses as shown in FIGS. 4A and 4B.

Next, all of the Cr film 102 is removed, the condition thereof being shown at the step (C) in FIG. 16. The glass substrate thus formed is used as a stamper (i.e., a mold) 108 in the following steps. The size of the recess 106 may be enlarged by implementing an etching process again after removing the Cr film.

On the other hand, a line-shaped mask is formed by a resin adhesive tape 132 with respect to the area including a bonding pad 82 on the surface of the light-emitting thyristor array wafer 112. While a line-shaped mask is formed by the adhesive tape 132 on the bonding pad portion, a mask may also be formed by an adhesive tape with respect to the portion where a resin is not required such as the portion where a conductor is to be exposed, the line-shaped portion along which the chips are cut and isolated, and the like. The end of the adhesive tape 132 is required to be outside the resin layer in order to peel off the adhesive tape.

In order to paste the adhesive tapes precisely to a plurality of predetermined area, the following means may be utilized. First, a silica glass substrate is prepared, and a masking pattern is drew thereon by a printing or marking, or a marker for alignment to the wafer is printed or marked thereon. As the adhesive tape, a both-side adhesive tape may be used. The adhesion on one side thereof is a type of one which loose its adhesiveness by ultra violet irradiated. The both-side adhesive tape is pasted to the glass substrate in such a manner that said one side is faced to the glass substrate. After that, the both-side adhesive tape is cut out along the masking pattern to remove unnecessary portions not to be used as a mask.

The glass substrate is aligned to the light-emitting thyristor array wafer, and is adhered to the surface of the wafer utilizing its adhesive strength of the tape. Next, ultra violet is irradiated from the glass substrate to loose the adhesiveness on said one side of the both-side adhesive tape, as a result the glass substrate may be removed.

Figure 17:
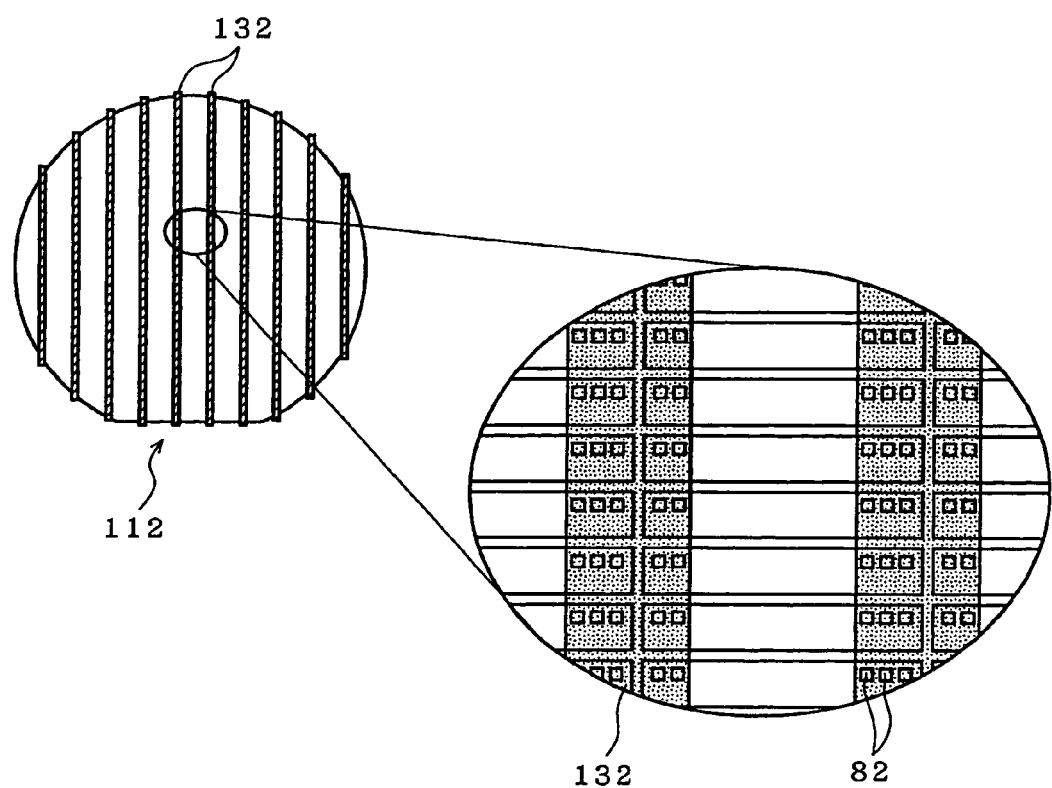
FIG. 17 shows a light-emitting thyristor array chip on which an adhesive tape is adhered.

FIG. 17 shows a light-emitting thyristor array wafer 112 on which the adhesive tape 132 is adhered. The adhesive tape masks the portion including the bonding pads 82.

After coating the ultra violet-curing resin 110 to the light-emitting thyristor array wafer 112 provided with this mask, the stamper 130 on the surface thereof a mold releasing agent is coated is pressed to the wafer as shown at the step (E) in FIG. 16 to develop the resin, and the resin is cured by irradiating the ultra violet 114 from the stamper side.

Finally, after removing the stamper 130 as shown at the step (F) in FIG. 16, the adhesive tape 132 provided on the light-emitting thyristor wafer 112 is peeled off together with the cured resin thereon. As a result, a lens array may be structured at a predetermined position, and the resin on the bonding pad 82 may be removed as shown at the step (G) in FIG. 16.

The bonding pad 82 after removing the adhesive tape 132 maintains its conductivity, and there is no uncured resin on the bonding pad. Therefore, cleaning is not required for removing the residual resin. The distance between the surface of the light-emitting thyristor and the upper surface of the lens is optimized by selecting the amount of coated resin, the magnitude of pressure, the time of pressure, and the thickness of the adhesive tape.

In the two embodiment according to the manufacturing method, the lens arrays in which there is no antireflection film at the interface between the light-emitting area and the resin lens have been described. In the case that an antireflection film is provided, the step for fabricating the light-emitting thyristor includes the step for forming the antireflection film.

Figure 18:
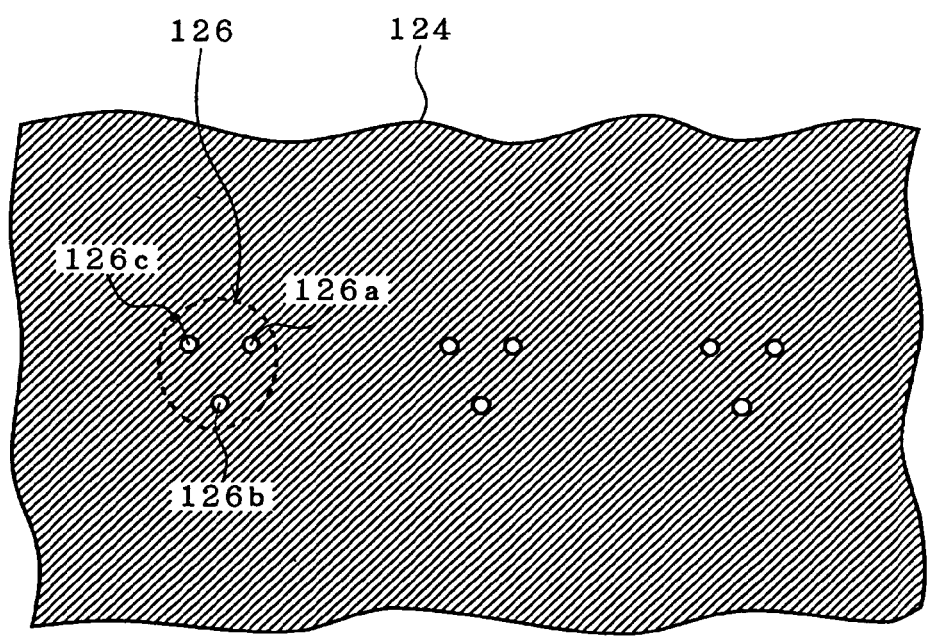
FIG. 18 shows a plan view of a silica glass substrate provided with the Cr film in which an opening array is patterned.

In the method for manufacturing the lens-attached light-emitting thyristor array described above, the composite lens shown in FIGS. 4A and 4B was fabricated. In the case that the composite lens shown in FIG. 7 is fabricated, a silica glass substrate 124 provided with a Cr film in which an opening array is patterned as shown in FIG. 18 is used at the steps shown in FIG. 16. The openings 126 each consists of three micro circular openings 126a, 126b and 126c which are located at the vertexes of a triangle, and are arrayed at an equal pitch. The positions of the micro circular openings to the dots 53, 54 and 56 shown in FIG. 7.

The silica glass substrate having such openings and provided with the Cr film is etched by hydrofluoric acid. The etching proceeds isotropically, i.e., in a hemispherical manner from respective micro circular openings to form recesses, the shape thereof corresponding to the shape of the composite lens.

It is easily understood that a composite lens-attached self-scanning light-emitting array chip may be manufactured by fabricating a stamper in a manner described above and repeating the same steps.

INDUSTRIAL APPLICABILITY

According to the lens-attached light-emitting element according to the present invention, an optical availability efficiency for the light emitted in Lambertian distribution may be increased by causing a lens to be a composite lens. According to the manufacturing method, a composite lens-attached light-emitting element array may be manufactured. Using such a composite lens-attached light-emitting element array, the light ray may be effectively conducted to the rod lenses to increase substantially an optical availability efficiency.

The invention claimed is:

1. A lens-attached light-emitting element comprising:
  a light-emitting element having a light-emitting area on a semiconductor substrate, the light-emitting area having an approximately U-shape including three line segments that form two intersections of line segments;
  an antireflection film covering the light-emitting area; and
  a lens formed on the surface of the antireflection film on the light-emitting element,
  wherein the lens comprises three cylindrical portions disposed coaxially on respective line segments of the light-emitting area, two spherical portions disposed concentrically on respective intersections of line segments of the light-emitting area, and two spherical portions disposed concentrically on respective ends of the line segments not forming the two intersections.

2. The lens-attached light-emitting element according to claim 1, wherein the composite lens is made of resin.

3. The lens-attached light-emitting element according to claim 2, wherein the antireflection film is one-layer film, and the refractive index thereof has an intermediate value between that of the light-emitting area and that of the resin forming the composite lens.

4. The lens-attached light-emitting element according to claim 3, wherein the antireflection film consists of silicon nitride.

5. A lens-attached light emitting element comprising:
  a light-emitting element having a light-emitting area, the light-emitting area having an approximately U-shape including three line segments that form two intersections of line segments; and
  a composite lens provided on the light-emitting element;
  wherein the composite lens comprises three cylindrical portions disposed coaxially on respective line segments of the light-emitting area, two spherical portions disposed concentrically on respective intersections of line segments of the light-emitting area, and two spherical portions disposed concentrically on respective ends of the line segments not forming the two intersections.

6. The lens-attached light-emitting element according to claim 5, wherein the composite lens is made of resin.

7. A lens-attached light-emitting element array, comprising a plurality of lens-attached light-emitting elements arranged in a straight line, the lens-attached light-emitting element being recited in claim 1 or 5.

8. The lens-attached light-emitting element array according to claim 7, wherein the light-emitting element is a light-emitting diode.

9. The lens-attached light-emitting element array according to claim 7, where the light-emitting element is a light-emitting thyristor.

10. A self-scanning light-emitting element array, comprising a lens-attached light-emitting element array recited in claim 9.

11. A method for manufacturing a lens-attached light-emitting element, comprising the steps of:
  (a) preparing a light-emitting element array substrate;
  (b) preparing a glass substrate;
  (c) forming a etching stopper film on the glass substrate;
  (d) forming an opening array in the etching stopper film;
  (e) forming an array of recesses in the glass substrate under the opening array by wet etching, each recess having an approximately U-shape including three line segments that form two intersections of line segments, each recess comprising three cylindrical concavities disposed coaxially on respective line segments of the recess, two spherical concavities disposed concentrically on respective intersections of line segments of the recess, and two spherical concavities disposed concentrically on respective ends of the line segments not forming the two intersections;
  (f) fabricating a mold by removing the etching stopper film on the array of recesses;
  (g) coating a photo-curing resin on the surface of at least one of the recesses of the mold and the light-emitting element array substrate;
  (h) contacting the mold and the light emitting element array substrate to each other with sandwiching the photo-curing resin therebetween and pressing to each other develop the photo-curing resin therebetween;
  (i) irradiating light to the photo-curing resin from the side of the mold to cure the photo-curing resin at the portion where the etching stopper film is previously removed;
  (j) separating the mold from the light-emitting element array substrate; and
  (k) removing the uncured photo-curing resin on the light emitting element array substrate by cleaning.

12. The method for manufacturing a lens-attached light-emitting element according to claim 11, further comprising the step of coating a mold releasing agent on the surface of the recess array after the step (f).

13. The method for manufacturing a lens-attached light-emitting element according to claim 11, wherein the step (i)

includes the step of making ultra violet or visible light to approximately collimated light and irradiating the collimated light approximately perpendicular to the glass substrate.

14. The method for manufacturing a lens-attached light-emitting element according to claim 11, wherein the etching stopper film is a Cr film, and the glass substrate is wet etched by a hydrofluoric acid based etchant.

15. The method for manufacturing a lens-attached light-emitting element according to claim 11, further comprising the step of cutting the light-emitting element array substrate after the step (k).

16. The method for manufacturing a lens-attached light-emitting element according to claim 11, wherein the light-emitting element array substrate is a light-emitting diode array substrate.

17. The method for manufacturing a lens-attached light-emitting element according to claim 11, wherein the light-emitting element array substrate is a light-emitting thyristor array substrate.

18. The method for manufacturing a lens-attached light-emitting element according to claim 11, wherein the light-emitting element array substrate is a self-scanning light-emitting element array substrate.

19. The method for manufacturing a lens-attached light-emitting element according to claim 11, wherein the light-emitting element array substrate includes an antireflection film covering the light-emitting area of each light-emitting element.

* * * * *